United States Patent
Fukaya

(10) Patent No.: US 9,032,613 B2
(45) Date of Patent: May 19, 2015

(54) METHOD FOR MAKING CIRCUIT BOARD

(75) Inventor: Naohiro Fukaya, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 976 days.

(21) Appl. No.: 13/166,152

(22) Filed: Jun. 22, 2011

(65) Prior Publication Data

US 2012/0005895 A1   Jan. 12, 2012

(30) Foreign Application Priority Data

Jul. 9, 2010   (JP) ................................. 2010-157164

(51) Int. Cl.
| | |
|---|---|
| H05K 3/36 | (2006.01) |
| H05K 3/30 | (2006.01) |
| H01L 21/00 | (2006.01) |
| H01L 21/331 | (2006.01) |
| B24B 1/00 | (2006.01) |
| H05K 3/00 | (2006.01) |
| H05K 1/02 | (2006.01) |

(52) U.S. Cl.
CPC ............ *H05K 3/0052* (2013.01); *H05K 1/0292* (2013.01); *H05K 2203/0228* (2013.01); *H05K 2203/175* (2013.01)

(58) Field of Classification Search
CPC ............... H05K 1/0292; H05K 3/0052; H01L 2924/01078; H01L 2924/01079; H01L 21/331
USPC .......... 29/830, 832; 438/113, 343; 451/57, 58
See application file for complete search history.

(56) References Cited

U.S. PATENT DOCUMENTS

| | | | | |
|---|---|---|---|---|
| 5,059,899 | A * | 10/1991 | Farnworth et al. .............. | 438/18 |
| 5,981,971 | A * | 11/1999 | Miyakawa ........................ | 257/48 |
| 6,531,370 | B2 * | 3/2003 | Sakamoto et al. ............. | 438/343 |
| 7,663,225 | B2 * | 2/2010 | Kudo et al. .................... | 257/700 |
| 8,470,625 | B2 * | 6/2013 | Zaima et al. .................... | 438/40 |
| 2007/0199734 | A1 * | 8/2007 | Kudo et al. .................... | 174/255 |
| 2012/0005895 | A1 * | 1/2012 | Fukaya ........................... | 29/850 |

FOREIGN PATENT DOCUMENTS

| | | |
|---|---|---|
| CN | 1344133 A | 4/2002 |
| CN | 1914699 A | 2/2007 |
| JP | A-54-37264 | 3/1979 |

(Continued)

OTHER PUBLICATIONS

Chinese Office Action Dated Jul. 1, 2013 of the Corresponding Chinese Patent Application, Partial English Translation of the Respective Parts Encircled by a Wavy Line As the Examiner's Comments in the Chinese Office Action.
JP Office Action dated May 13, 2014 and partial English translation thereof.

(Continued)

*Primary Examiner* — David Angwin
(74) *Attorney, Agent, or Firm* — Roberts Mlotkowski Safran & Cole P.C.

(57) ABSTRACT

A method for making a circuit board includes separating a plurality of versatile circuit boards from a collective board by cutting a connecting portion of the collective board, the plurality of versatile circuit boards being connected each other via the connecting portion, and cutting a part of a wiring formed on each of the plurality of versatile circuit boards to produce the circuit board. The cutting of the part of the wiring is conducted within the separating of the plurality of versatile circuit boards.

4 Claims, 3 Drawing Sheets

(56) References Cited

FOREIGN PATENT DOCUMENTS

| | | | |
|---|---|---|---|
| JP | 2008-041787 | | 2/2008 |
| JP | 2008-299594 | * | 12/2008 |

OTHER PUBLICATIONS

JP Office Action and partial English translation dated Dec. 24, 2013.

* cited by examiner

| FIG.1 | |
|---|---|
| 4 PERFORATION | FIG.2 |
| 5 CONNECTING PORTION | 2a-2d CUTTABLE PART OF WIRING |
| 11 VERSATILE CIRCUIT BOARD | 6A-6D REGION OF CUTTABLE PART |

METHOD FOR MAKING CIRCUIT BOARD

The present application is based on Japanese patent application No. 2010-157164 filed on Jul. 9, 2010, the entire contents of which are incorporated herein by reference.

BACKGROUND OF THE INVENTION

1. Field of the Invention

This invention relates to a method for making a circuit board and, in particular, to a method for making a circuit board wherein a versatile circuit board is used for making different circuit boards such as a left-hand drive car circuit board and a right-hand drive car circuit board.

2. Description of the Related Art

A method for making a printed circuit board is known that a printed conductor is wired on a versatile in order to apply to various circuits, the printed conductor for a circuit section is previously connected to be selected and changed according to the kind of an application circuit, and connection-free part of the printed conductor in the circuit section is cut as well as a wiring board of the versatile printed circuit board.

The related art to the invention may include JP-A-54-37264.

SUMMARY OF THE INVENTION

However, the cutting step for cutting the printed conductor in the connection-free part from the versatile printed circuit board has been conducted separately from the other steps. Therefore, a problem arises that the manufacturing cost of the circuit board increases due to the separate cutting step.

In addition, the cutting step needs to be conducted after the versatile printed circuit board is stored as a stock. Therefore, problems arise that the stock of the versatile printed circuit board increases and that the versatile printed circuit board other than the application may be erroneously applied to the cutting line.

It is an object of the invention to provide a method for making a circuit board that allows a decrease in the manufacturing cost and prevents the increase of the manufacturing cost.

(1) According to one embodiment of the invention, a method for making a circuit board comprises:

separating a plurality of versatile circuit boards from a collective board by cutting a connecting portion of the collective board, the plurality of versatile circuit boards being connected each other via the connecting portion; and cutting a part of a wiring formed on each of the plurality of versatile circuit boards to produce the circuit board, wherein the cutting of the part of the wiring is conducted within the separating of the plurality of versatile circuit boards.

In the above embodiment (1) of the invention, the following modifications and changes can be made.

(i) The part of the wiring is formed in a vicinity of the connecting portion of the collective board.

(ii) The part of the wiring is formed one or more at each side of the connecting portion.

(iii) The separating of the plurality of versatile circuit boards and the cutting of the part of the wiring are conducted along a route to pass through serially the connecting portion and the part of the wiring.

(iv) The part of the wiring is formed in a longitudinal direction of the connecting portion.

(v) The route to pass through serially the connecting portion and the part of the wiring comprises a route to allow a connection of an end point of the separating and a start point of the cutting.

(vi) The collective board comprises a necessary parts mounted thereon before separating of the plurality of versatile circuit boards and the cutting of the part of the wiring.

(vii) The circuit board is used for an automobile.

(viii) The circuit board comprises a left-hand drive car circuit board and a right-hand drive car circuit board of the automobile.

Effects of the Invention

According to one embodiment of the invention, a method for making a circuit board is conducted such that a wiring cutting step is conducted within a versatile circuit boards separating step. Therefore, a desired circuit board produced by the wiring cutting step conducted together with the versatile circuit boards separating step can be made without increasing the manufacturing cost and without loss of production (or in good yield). Thus, the method for making the circuit board of the embodiment can allow a decrease in the manufacturing cost and prevents the increase of the manufacturing cost.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Embodiment

A method of making a circuit board in the embodiment includes a versatile circuit board forming step, a dividing step, and a wiring cutting step.

Figure 1:
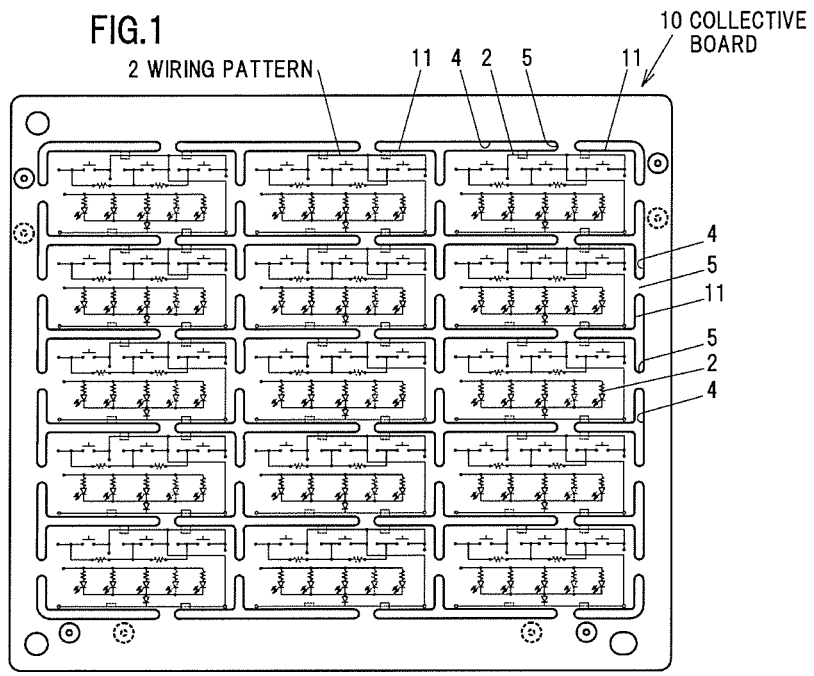
FIG. 1 is a plan view showing a collective board used for a method of making a circuit board in a preferred embodiment according to the invention.
Figure 2:
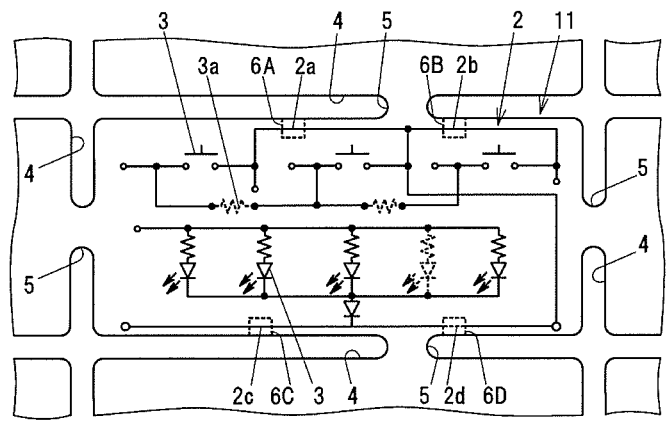
FIG. 2 is a plan view showing one versatile circuit board formed in the collective board of the embodiment.

In the versatile circuit board forming step, as shown in FIG. 1, plural certain versatile wiring patterns 2 are printed on one collective board 10, and perforations 4 are formed by pressing inside the collective board 10 such that plural versatile circuit boards 11 with a same shape are formed in the collective board 10. As shown in FIG. 2, various circuit elements 3 are mounted on the plural same-shaped versatile circuit boards 11. As shown in FIGS. 1 and 2, the perforations 4 of the collective board 10 are formed on a boundary between the plural versatile circuit boards 11 or between the collective board 10 and the versatile circuit boards 11 where the versatile circuit boards 11 are to be separated from the collective board 10. With the perforations 4 thus formed, connecting portions 5 are formed left therebetween such that they keep the plural versatile circuit boards 11 connected to each other.

Herein, a versatile circuit board 11 is defined as a circuit board that is used in manufacture for obtaining different kinds of circuit boards 1 that can provide same, common or similar functions each other. An example as needing the versatile circuit board 11 may be a method of making various circuit boards used for automobiles.

With respect to various circuit boards used for automobiles, even in same type of cars, it may be necessary to make plural kinds of similar circuit boards according to a slight difference such as a difference in position of steering wheel, a difference in equipment between grades in that car type, and a difference between the national model specification and the export model specification. The same applies to the case of sibling model cars and common parts.

Figure 3A:
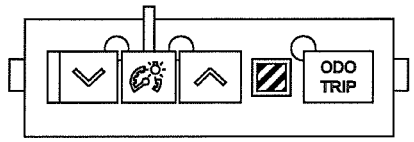
FIG. 3A is a plan view showing an exterior of a desired circuit board separated from the collective board of the embodiment.
Figure 3B:
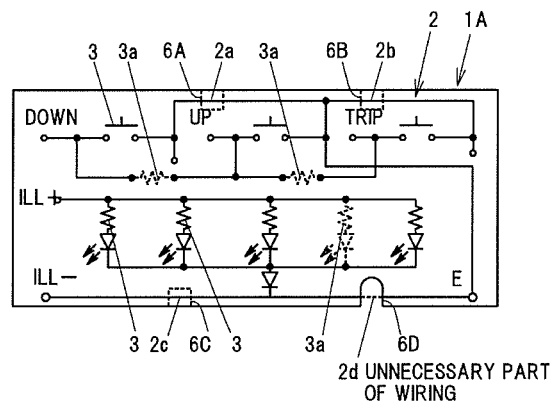
FIG. 3B is a diagram showing an equivalent circuit of the desired circuit board separated from the collective board of the embodiment.
Figure 4A:
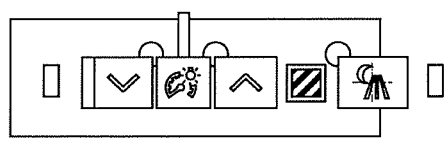
FIG. 4A is a plan view showing an exterior of another desired circuit board separated from the collective board of the embodiment.
Figure 4B:
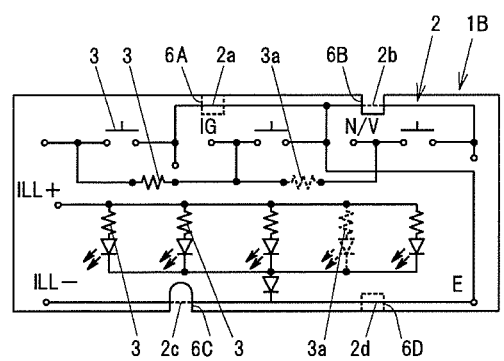
FIG. 4B is a diagram showing an equivalent circuit of a desired circuit board separated from the collective board of the embodiment.

For example, as shown in FIGS. 3B and 4B, the similar circuit boards 1A and 1B (wherein numeral 1 is a general number for the parts numbers, 1A and 1B) have a lot in common except that an unnecessary part 2a, 2b, 2c or 2d of wiring formed in predetermined region 6A, 6B, 6C or 6D is cut off and unnecessary circuit elements 3a are not mounted. Thus, the versatile circuit board 11 may be used for making the plural kinds of circuit boards 1 similar to each other.

Figure 5:
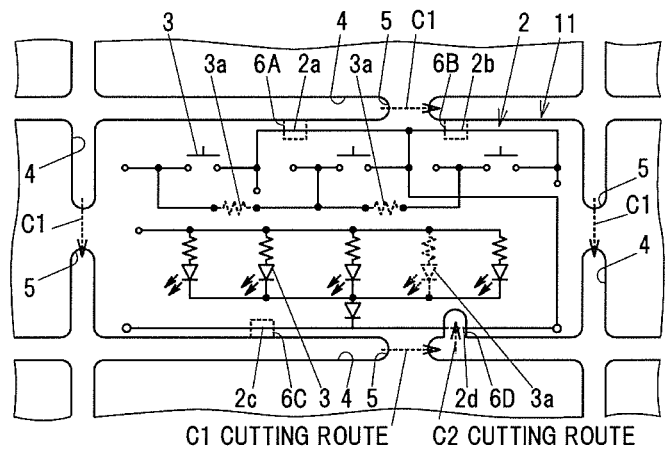
FIG. 5 is a plan view showing a dividing step and a wiring cutting step conducted to one versatile circuit board formed in the collective board of the embodiment.

In the dividing step, as shown in FIG. 5, a router bit for a router type board divider is passed through, e.g., a route as shown by a first arrow C1 with dashed line so as to cut off the connecting portion 5 of the collective board 10. In the embodiment, since the versatile circuit boards 11 are each connected by the four connecting portions 5, the plural versatile circuit boards 11 can be separated from the collective board 10 by cutting off the four connecting portions 5 per one versatile circuit board 11.

The wiring cutting step is conducted with the cutting work of the connecting portions 5 within (or during) the dividing step. For example, the wiring cutting step is conducted such that the router bit is passed through, e.g., a route as shown by a second arrow C2 so as to cut off a part 2d, or 2c and 2b of the wiring formed on the versatile circuit board 11.

Figure 6:
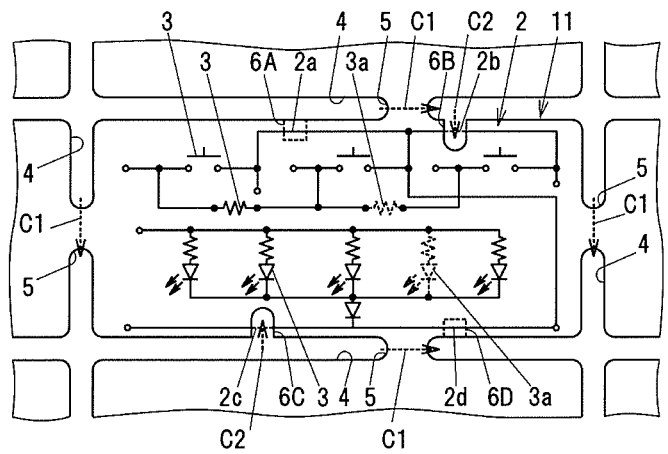
FIG. 6 is a plan view showing a dividing step and a wiring cutting step conducted to one versatile circuit board formed in the collective board of the embodiment.

In detail, as shown in FIG. 5, when the circuit board 1A as in FIG. 3B is made, the unnecessary part 2d of wiring formed in the predetermined region 6D located at the bottom right of the versatile circuit board 11 is removed by cutting. Also, as shown in FIG. 6, when the circuit board 1B as in FIG. 4B is made, the unnecessary parts 2b and 2c of wiring formed in the predetermined region 6B located at the top right and the predetermined region 6C located at the bottom left, respectively, of the versatile circuit board 11 are removed by cutting. Thus, the versatile circuit board 11 can be formed into the desired circuit board 1.

Although for convenience the wiring cutting step is described independently from the dividing step, the cutting works conducted in the dividing step and the wiring cutting step are similar works by using the same router bit. Thus, the cutting works of the dividing step and the wiring cutting step are preferably conducted in series. In general, in cutting off some of the plural connecting portions 5, the work flow is conducted such that the unnecessary part 2a, 2b, 2c or 2d of wiring is cut together with the connecting portion 5 when it is located near the connecting portion 5.

Therefore, as shown in FIGS. 5 and 6, the part 2a, 2b, 2c or 2d of wiring to be cut off in the wiring cutting step is preferably formed in the vicinity of the connecting portion 5 to be cut in the dividing step.

The unnecessary part of wiring is, as shown in FIGS. 5 and 6, preferably formed one or more at each side (in the longitudinal direction) of the connecting portion 5. In the embodiment, the parts 2a, 2b, 2c and 2d of wiring to be cut off in the wiring cutting step are formed one at each side (in the longitudinal direction of) the connecting portions 5 vertically formed in the versatile circuit board 11.

The cutting route of the cutting work in the dividing step and wiring cutting step is preferably a route to serially pass through the connecting portion 5 and the part 2a, 2b, 2c or 2d of wiring. For example, as shown in FIGS. 5 and 6, the cutting route is preferably controlled such that the router bit of the router type board divider passes through a route allowing the connection of the end point of the route of the first arrow C1 with dashed line and the start point of the route of the second arrow C2 with dashed line.

Effects of the Embodiment

According to the embodiment, the method of making the circuit board 1 is developed such that, as shown in FIGS. 5 and 6, the wiring cutting step is conducted within the dividing step, i.e., the wiring cutting step being conducted inserted into the dividing step. Therefore, the desired circuit board 1 can be made without increasing the manufacturing cost and without loss of production, as compared to the conventional method for making a desired circuit board by removing the unnecessary part 2a, 2b, 2c or 2d of wiring from the versatile circuit board 11 stored as a stock after the collective board 10 is divided.

In the method of the embodiment, as shown in FIGS. 1 and 2, the unnecessary part 2a, 2b, 2c or 2d of wiring is preferably formed in the vicinity of the connecting portion 5. Thereby, the cutting work for the connecting portion 5 can be serially conducted with the cutting work for the wiring.

Also, in the method of the embodiment, as shown in FIGS. 1 and 2, the parts 2a, 2b, 2c and 2d of wiring to be cut off in the wiring cutting step are preferably formed one at each side (in the longitudinal direction of) the connecting portions 5 vertically formed in the versatile circuit board 11. As a matter of course, the parts 2a, 2b, 2c and 2d of wiring to be cut off in the wiring cutting step may be formed two or more at each side (in the longitudinal direction of) the connecting portions 5. Thus, the various desired circuit boards 1 can be obtained from the versatile circuit board 11.

Further, in the method of the embodiment, as shown in FIGS. 5 and 6, the cutting route of the cutting work in the dividing step and wiring cutting step is preferably a route to serially pass through the connecting portion 5 and the part 2a, 2b, 2c or 2d of wiring, such that the cutting route passes through a route allowing the connection of the end point and the start point of the cutting route of the connecting portion 5. Therefore, since the dividing step and the wiring cutting step can be conducted in the serial flow without being separated, failure in cutting the part 2a, 2b, 2c or 2d of wiring can be prevented and the manufacturing time can be shortened.

As described above, in the embodiment of the invention, the wiring cutting step is conducted within the dividing step. Therefore, the desired circuit board can be made without increasing the manufacturing cost and without loss of production (or in good yield). Thus, the method for making the circuit board of the embodiment can allow a decrease in the manufacturing cost and prevents the increase of the manufacturing cost.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

For example, the collective board 10 subjected to the dividing step and the wiring cutting step by the router type board divider may be arranged such that necessary parts are mounted on each of the versatile circuit boards 11. In other words, the method may be modified such that the necessary parts are mounted on the versatile circuit board 11 by a chip mounter, the collective board 10 is reflow-soldered in a reflow soldering bath, it is checked by a visual checker, and it is finally subjected to the dividing step and the wiring cutting step so as to produce the various types of desired circuit board 1 with the parts mounted thereon.

What is claimed is:

1. A method for making a circuit board, comprising:
    providing a collective board that includes a plurality of versatile circuit boards;
    separating the plurality of versatile circuit boards from the collective board by cutting a connecting portion of the collective board, the plurality of versatile circuit boards being connected to each other via the connecting portion and each comprising a versatile circuit wiring pattern formed from wiring thereon; and
    cutting a part of the wiring formed on each of the plurality of versatile circuit boards to produce the circuit board,
    wherein the cutting of the part of the wiring of the versatile circuit wiring pattern is conducted during the step of separating the plurality of versatile circuit boards, and
    wherein none of the wiring of the versatile circuit wiring pattern is on the connecting portion.

2. The method according to claim 1, wherein the part of the wiring is formed proximate to the connecting portion of the collective board.

3. The method according to claim 2, wherein the part of the wiring is formed one or more at each side of the connecting portion.

4. The method according to claim 3, wherein the part of the wiring is formed along a length of the connecting portion.

* * * * *